(12) United States Patent
Almy et al.

(10) Patent No.: US 10,505,495 B2
(45) Date of Patent: Dec. 10, 2019

(54) PV TILE MOUNTING SYSTEM

(71) Applicant: Tesla, Inc., Palo Alto, CA (US)

(72) Inventors: Charles Bernardo Almy, Berkeley, CA (US); Johann Fritz Karkheck, Petaluma, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 15/909,880

(22) Filed: Mar. 1, 2018

(65) Prior Publication Data

US 2019/0273462 A1    Sep. 5, 2019

(51) Int. Cl.
| | | |
|---|---|---|
| *H02S 20/25* | (2014.01) | |
| *H02S 40/34* | (2014.01) | |
| *E04D 1/34* | (2006.01) | |
| *H01L 31/048* | (2014.01) | |
| *H02S 30/10* | (2014.01) | |
| *H02S 40/36* | (2014.01) | |
| *E04D 12/00* | (2006.01) | |
| *E04D 1/12* | (2006.01) | |
| *H01B 7/00* | (2006.01) | |
| *H02G 3/30* | (2006.01) | |
| *H01R 13/64* | (2006.01) | |

(52) U.S. Cl.
CPC ............ *H02S 20/25* (2014.12); *E04D 1/12* (2013.01); *E04D 1/34* (2013.01); *E04D 12/006* (2013.01); *H01L 31/048* (2013.01); *H02S 30/10* (2014.12); *H02S 40/34* (2014.12); *H02S 40/36* (2014.12); *E04D 2001/3491* (2013.01); *H01B 7/0045* (2013.01); *H01R 13/64* (2013.01); *H02G 3/30* (2013.01)

(58) Field of Classification Search
CPC .......... H02S 20/25; H02S 30/10; H02S 40/34; H02S 40/36
USPC .......................................... 248/237; 52/173.3
See application file for complete search history.

(56) References Cited

U.S. PATENT DOCUMENTS

| | | | | |
|---|---|---|---|---|
| 5,027,567 | A * | 7/1991 | Roberts | E04D 3/06 52/204.593 |
| 5,061,531 | A * | 10/1991 | Catalano | E06B 3/20 156/107 |
| 5,384,653 | A * | 1/1995 | Benson | E06B 3/6722 359/265 |
| 6,360,497 | B1 * | 3/2002 | Nakazima | E04D 1/24 126/622 |
| 2002/0036010 | A1 * | 3/2002 | Yamawaki | E04D 1/30 136/251 |
| 2004/0221886 | A1 * | 11/2004 | Oono | H02S 20/25 136/251 |
| 2014/0246079 | A1 * | 9/2014 | Moon | H01L 31/0201 136/251 |
| 2016/0054030 | A1 * | 2/2016 | Ilzhofer | F24S 25/33 248/237 |

(Continued)

*Primary Examiner* — Paola Agudelo
(74) *Attorney, Agent, or Firm* — Kilpatrick Townsend & Stockton LLP

(57) ABSTRACT

Building integrated photovoltaic (BIPV) systems provide for solar panel arrays that can be aesthetically pleasing to an observer. BIPV systems can be incorporated as part of roof surfaces as built into the structure of the roof, particularly as photovoltaic tiles. Each photovoltaic module may comprise an inner sheet, an outer sheet, photovoltaic cells, and a bracket. When installed the bracket may be covered by up-roof tiles, giving the overall roof a uniform appearance.

12 Claims, 11 Drawing Sheets

(56) References Cited

U.S. PATENT DOCUMENTS

2018/0006602 A1* 1/2018 Bunea ................ H01L 31/0443
2018/0367093 A1* 12/2018 Ayers ................ H01L 31/0475
2019/0028054 A1* 1/2019 Karkheck ............... H02S 20/25

* cited by examiner

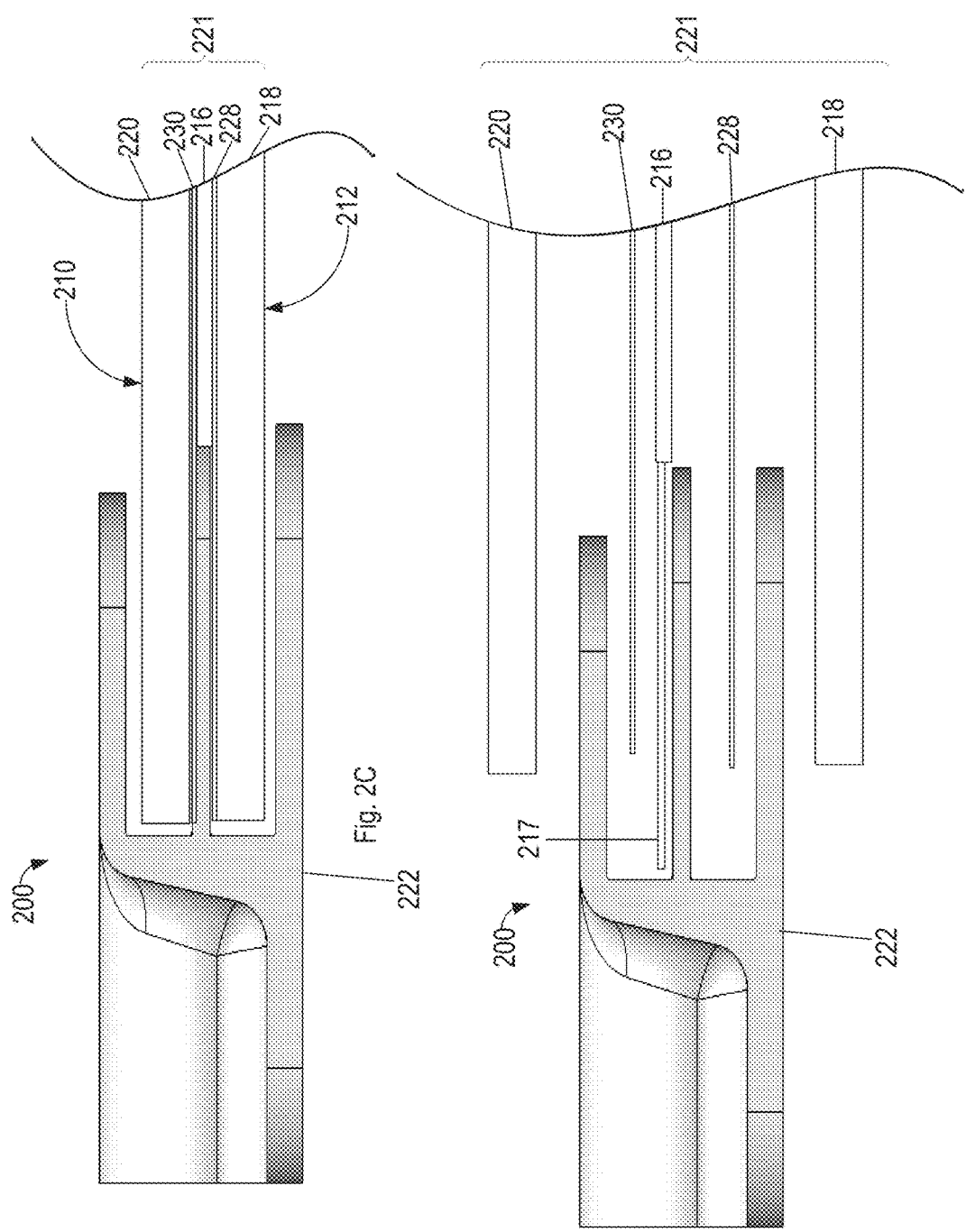

PV TILE MOUNTING SYSTEM

TECHNICAL FIELD

This generally relates to photovoltaic arrays.

BACKGROUND

Solar is becoming increasingly popular in the United States and abroad, but penetration remains relatively low versus the number of homes that could benefit from solar. The price per kilowatt-hour for solar is now competitive with or below that of fossil fuel based utility power in most areas, however, solar largely remains a niche product for those who value saving money, reducing $CO_2$ emissions, and/or people living off the grid.

One factor that may limit the adoption of solar technology is aesthetics. Most residential solar systems are installed as rectangular framed photovoltaic (PV) modules positioned above an existing tile or composite shingle roof. The solar array often only covers a portion of the roof and therefore stands out both in height and material as separate and distinct from the underlying existing roof. This structure is visible even from the street level and over large distances.

Another obstacle to solar adoption in existing homes is the dissonance between the age of the existing roof and the lifespan of a solar system, particularly where the existing roof is made from composite shingles. The expected life of a solar system is at least 25 years, and the expected life of a composite shingle roof ranges from 20 to 50 years, depending on the local climate and quality of materials. At the time a customer is considering going solar, their existing roof may have less remaining lifespan than the expected lifespan of a solar system. So when deciding to go solar, the customer may be presented with the dilemma of having to get a new roof in addition to the solar system, which dramatically increases the cost of going solar.

Accordingly, there is a need to resolve the dissonance between the expected life of the solar system and the remaining life of the roof, that also blends in aesthetically with the complete roof surface, and that does not require the prospective customer to pay for a new roof and a new solar system over that roof.

BRIEF SUMMARY

Various embodiments provide a new and improved approach to installing solar as a roofing surface. Some aspects are installed over existing roof structures (e.g., a metal roof, composite shingle, roof deck, underlayment or insulation layer). Some aspects have improved aesthetics that reduce the visual differences between solar and non-solar portions of the roof. In addition, some aspects cost less to make and install compared to conventional solar systems. These and other embodiments are discussed in greater detail in the detailed description and drawing figures.

BRIEF DESCRIPTION OF THE DRAWINGS

Illustrative aspects of the present disclosure are described in detail below with reference to the following drawing figures. It is intended that that embodiments and figures disclosed herein are to be considered illustrative rather than restrictive

FIG. 2C shows a side view of the PV module of FIG. 2A.

FIG. 2D shows an exploded side view of the PV module of FIG. 2A.

DETAILED DESCRIPTION

Figure 1A:
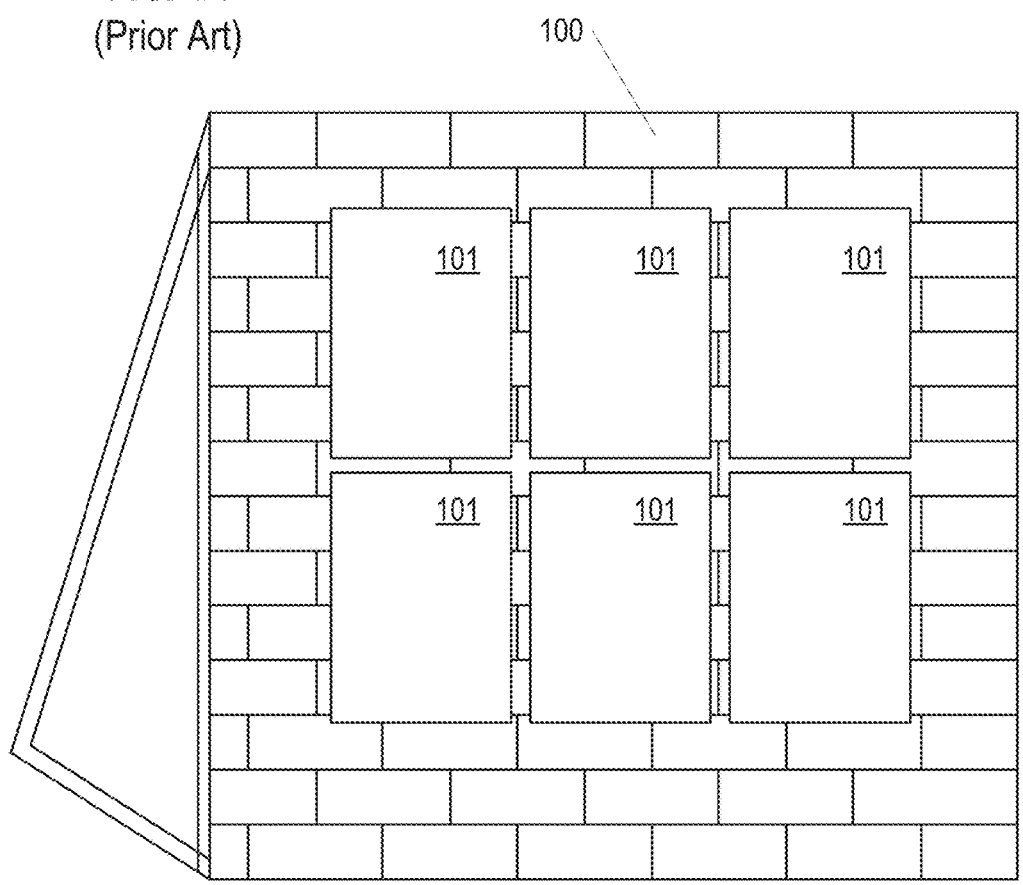
FIG. 1A shows an example of a prior art photovoltaic array installed on a roof.

The present disclosure describes various embodiments of photovoltaic roofing systems and associated systems and methods. Some embodiments relate to building integrated photovoltaic module assemblies and associated systems and methods. In various embodiments, the systems described herein eliminate the inherent redundancy involved with conventional solar while providing improved aesthetic for a PV roof system, and particularly a building integrated PV system.

Certain details are set forth in the following description and in the figures to provide a thorough understanding of various embodiments of the present technology. Other details describing well-known structures and systems often associated with PV systems and roofs are not set forth below to avoid unnecessarily obscuring the description of the various embodiments of the present technology.

Many of the details, dimensions, angles and other features shown in the figures are merely illustrative of particular embodiments. Accordingly, other embodiments can include other details, dimensions, angles and features without departing from the spirit or scope of the present invention. Various embodiments of the present technology can also include structures other than those shown in the Figures and are expressly not limited to the structures shown in the Figures. Moreover, the various elements and features shown in the Figures may not be drawn to scale. In the Figures, identical reference numbers identify identical or at least generally similar elements.

As used herein, the term "substantially" refers to the complete or nearly complete extent or degree of an action, characteristic, property, state, structure, item, or result. For example, an object that is "substantially" uniform in height to another object would mean that the objects are either completely or nearly completely uniform in height. The exact allowable degree of deviation from absolute completeness may in some cases depend on the specific context, however, generally speaking, the nearness of completion will be so as to have the same overall result as if absolute and total completion were obtained.

As used herein, the term "about" is used to provide flexibility to a numerical range endpoint by providing that a given value may be "above" or "below" the value. For example, the given value modified by about may be, for example, by ±5%, ±10%, ±15%, ±20%.

Wherever used throughout the disclosure and claims, the term "generally" has the meaning of "approximately" or "closely" or "within the vicinity or range of". The term "generally" as used herein is not intended as a vague or imprecise expansion on the term it is selected to modify, but rather as a clarification and potential stop gap directed at those who wish to otherwise practice the appended claims, but seek to avoid them by insignificant, or immaterial or small variations. All such insignificant, or immaterial or small variations should be covered as part of the appended claims by use of the term "generally".

As used herein, the term "building integrated photovoltaic system" or "BIPV" generally refers to photovoltaic systems integrated with building materials to form at least a portion of a building envelope. For example, the BIPV system can form the roof or roofing membrane of a building. The BIPV systems described herein can be retrofitted, can be a part of a new construction roof, or a combination of both. Such building integrated photovoltaic structures can be alternatively referred to as building integrable photovoltaic ("BIP") or building applied photovoltaics ("BAPV"). Components of a BIPV system used, in part, as the actual building envelope (e.g., roofing membrane), can provide a watertight or substantially watertight seal for the roof surface.

As used herein, the terms "up-roof", "down-roof", "side-roof", "left-roof" and "right-roof" are used to provide orientation, direction, position, or a reference point relative to or in context of a roof or roofing surface upon which the systems described herein are installed on and/or form a portion of Up-roof generally refers to an orientation that is relatively closer to the roof ridge while down-roof refers to an orientation that is relatively closer to the roof eave. Side-ride, left-roof and right-roof generally refers to an orientation that is relatively equidistance to the roof ridge and in line horizontally from the reference element. Embodiments herein may disclose features being on a left or right side of a PV module, or PV array. It is understood that all embodiments may be made as left/right mirror images of themselves and installation can be performed in left/right mirror orientation.

As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as shown in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below, depending on the context of its use. The device may be otherwise oriented (rotated 90 degrees or at other orientations) and the spatially relative descriptors used herein are interpreted accordingly.

Although the terms "first", "second", etc. may be used herein to describe various elements, components, regions, layers and/or sections, it should be understood that the terms do not connote the number or order of the elements. These terms are used to distinguish one element, component, region, layer, or section from another. Thus, a first element, component, region, layer, or section discussed below could be termed a second element, component, region, layer, or section without departing from the teachings of the present invention.

As used herein, the terms "and/or" and "at least one of" include any and all combinations of one or more of the associated listed items.

Referring now to the drawing figures, in contrast with embodiments of the present disclosure, FIG. 1A shows a prior art PV array installed on roof 100. The exemplary prior art PV array of FIG. 1A includes six framed PV modules 101, which though not shown in detail are mounted on roof 100 using one of various known rail-based or rail-free mounting systems, as are currently employed by solar installers.

Figure 1B:
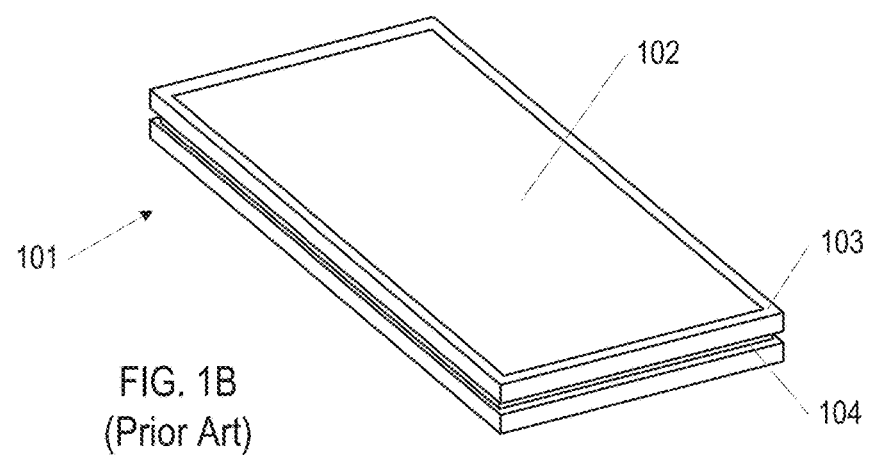
FIG. 1B shows an exemplary prior art photovoltaic module.

FIG. 1B shows one type of conventional PV module 101 in more detail. PV module panel 101 includes glass-on-glass PV laminate 102, which in conventional silicon-based cells, consists of a silicon sandwich of p-doped and n-doped silicon layers, a top glass sheet and a back glass sheet protecting and providing structural support for silicon-based cells, and rigid metal frame 103 around the perimeter providing additional structural support for laminate 102 and providing mounting points for PV module 101. Although shown as a unitary structure, laminate 102 may include a plurality of individual solar cells that are wired together to form a single unit between the sheets of glass. In the example shown in FIG. 1B, frame 103 is a grooved frame with groove 104 circumscribing the outer face of frame 103 on all sides. In such a module, groove 104 serves as mechanism for attaching mounting hardware to join modules together and to support the modules over a roof surface. Those of ordinary skill in the art will appreciate that PV module 101 may also have a plain, non-grooved frame. Non-grooved frames are typically interconnected to one another and connected to the roof using connectors that clamp down between the top and bottom edges of the rigid frame.

Although these types of framed PV modules achieve their structural function, they are aesthetically suboptimal and have material usage inefficiencies relative to BIPV roofing systems. First, conventional PV systems, such as that shown in FIG. 1A, are typically installed over an existing roof, and not as part of the existing roof, essentially requiring redundant structures since the PV array will shield most of the portion of the roof that it is installed over from the elements. Second, conventional systems are deemed by some people to be unappealing, having a choppy, discontinuous, and/or extraneous aesthetic. Conventional PV modules usually come in one of two colors: blue, signifying a poly-crystalline silicon structure, and black, signifying a mono-crystalline silicon or thin-film structure. Regardless of whether blue or black modules are used, the difference between the look of the portion of the roof that is covered with solar panels and the remainder of the roof is generally quite dramatic. This contrast can be particularly jarring with a conventional PV system and array mounted on a tile roof. As a result, roofs that are partially covered with solar panels have an aesthetic contrast that can be seen from very far distances due to the difference in reflectivity, elevation, height, and/or color between these two very different surfaces.

The technology disclosed herein includes one or more PV cells supported and laminated between two sheets of glass and including a mounting bracket on one side of the laminate stack to form a PV tile. The PV tile is frameless, in that edges in the reveal portion are substantially free of material added to the edge of the glass for providing structural support to the PV tile.

The PV tiles can be connected together and placed on an underlying roof structure so that they make up the main surface of the roof, and in particular, a roof visually appearing to be comprised of a plurality of tiles. PV tiles as disclosed herein may include multiple PV cells, for example two PV cells, which is advantageous compared to installing individual PV tiles with single PV cells because larger solar energy collection areas can be installed in a single step while also having the aesthetically pleasing appearance of roof tiles. Alternatively, tiles may be grouped together into individual modules to reduce external wiring. Further, roof surfaces formed of PV tiles as disclosed herein may be directly affixed to the framing structure of a roof and can be lighter than traditional on-roof arrays, at least because built-in solar arrays do not have heavy frames and related heavy frame support structures affixed above an existing roof. The PV tiles may be electrically connected in strings or other circuits located on an underside of an array of PV tiles which is visually appealing at least in that wiring is hidden from view.

PV tiles as disclosed herein may be mounted in a related manner as a standard tile roof, for example: securing and sealing underlayment or other sheathing to frame elements of the underlying roof structure, installing PV tiles to form the main surface of the roof, working around obstacles (e.g., chimneys, skylights, vents, etc.) as needed, and installing ridge and edge tiles in combination with flashing or other trim structures of the roof. The PV tiles have a structural integrity capable of accommodating and supporting the PV cells encapsulated in the PV tiles, in terms of weight, heat generated, ability to connect electronics, and retaining strength to serve as a portion of a roof surface. Further, the PV modules used for systems considered herein can have a wide range of colors to have a similar appearance to traditional non-PV roofing, including, but not limited to, blue, blacks, grays, browns, and natural clay colorations.

Figures 2A, 2B:
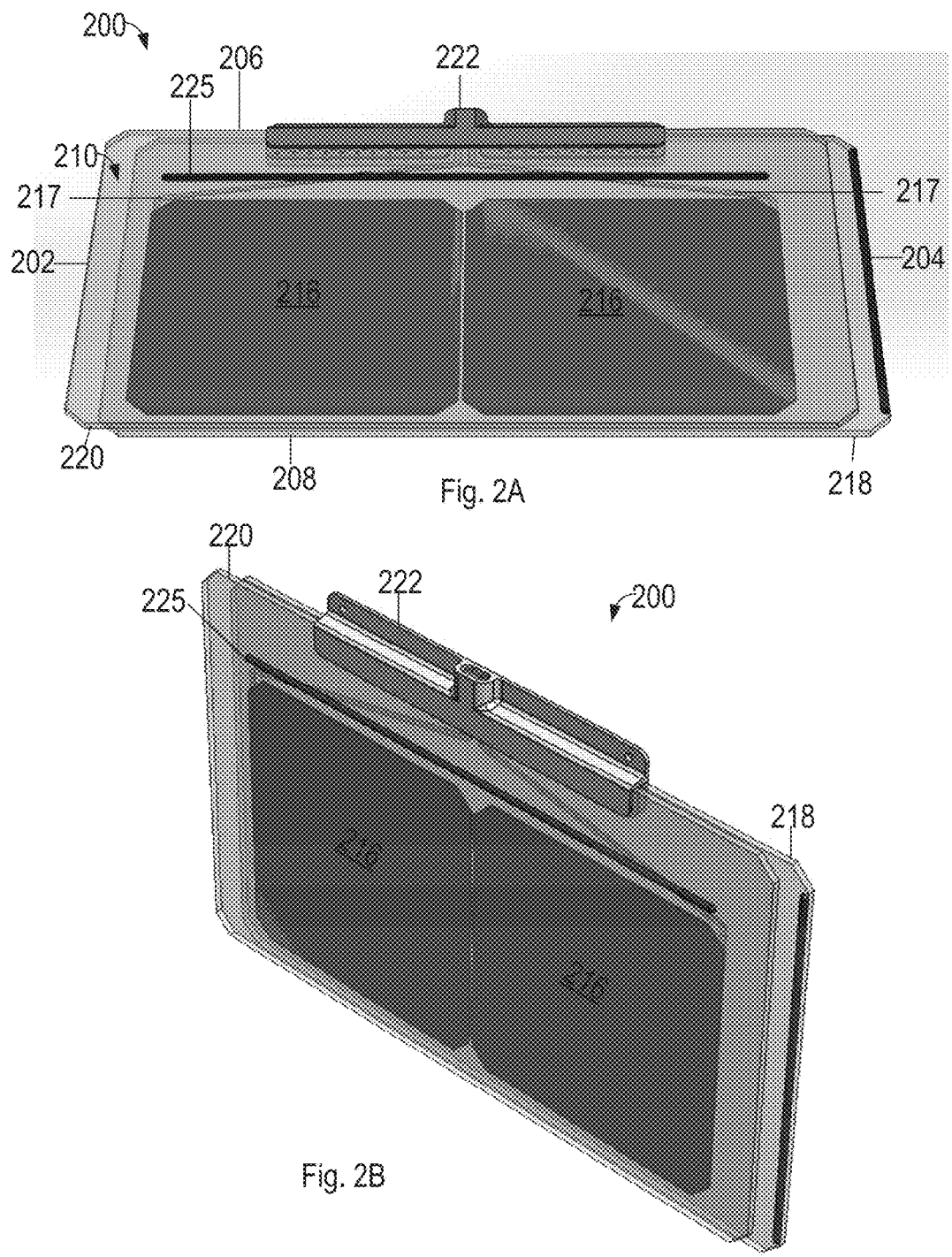
FIGS. 2A and 2B show perspective views of a PV module, in accordance with embodiments of the disclosure.
Figure 2E:
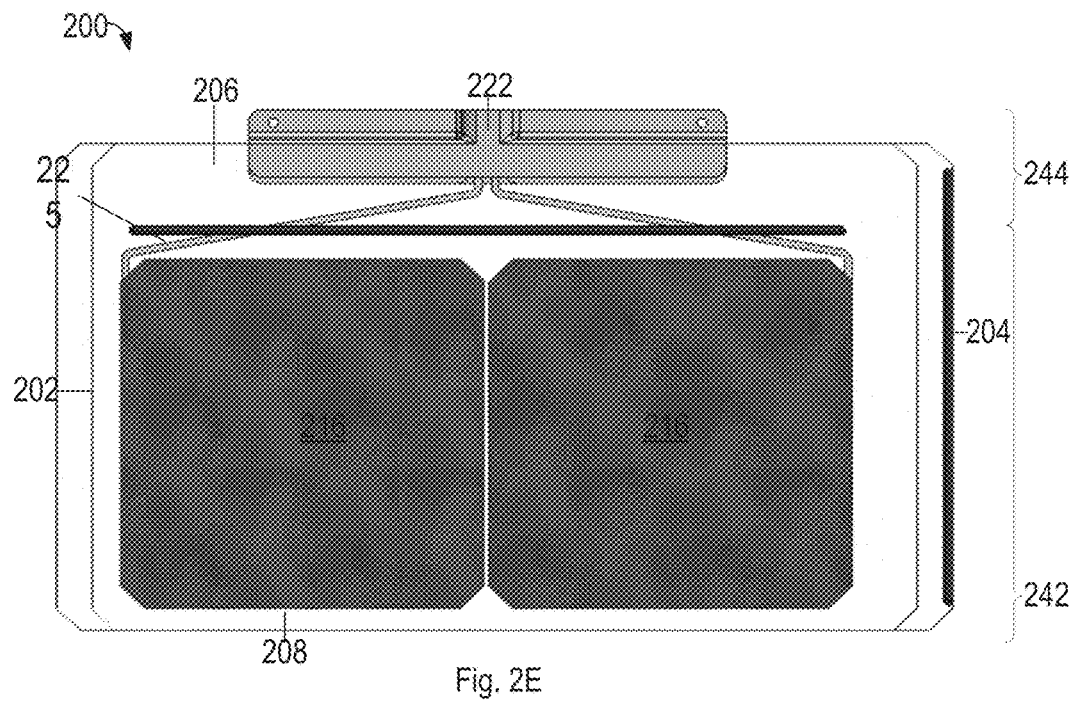
FIG. 2E shows a top view of the PV module of FIG. 2A.
Figure 2F:
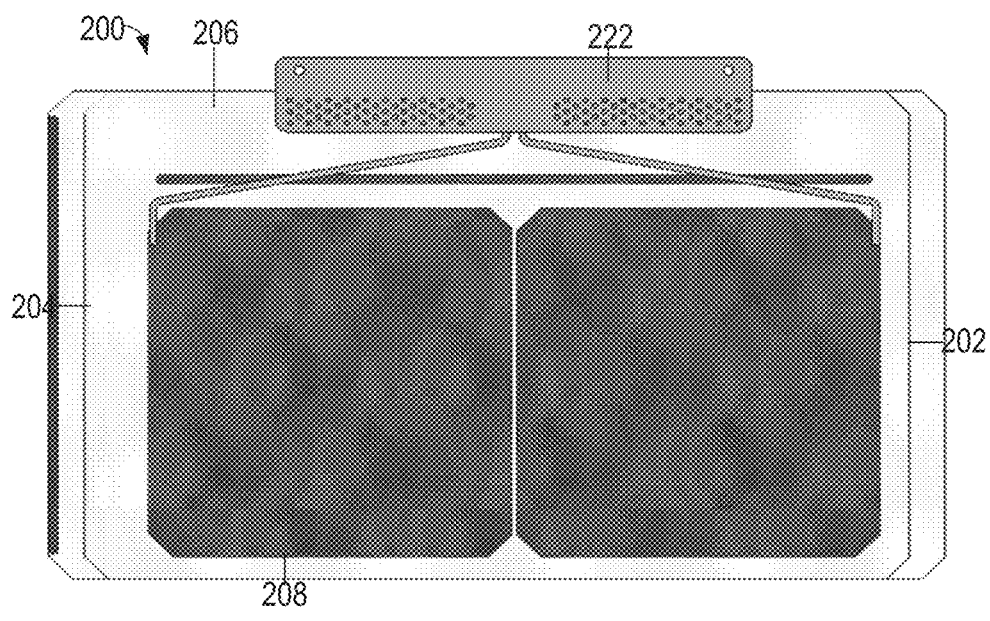
FIG. 2F shows a bottom view of the PV module of FIG. 2A.
Figure 2G:
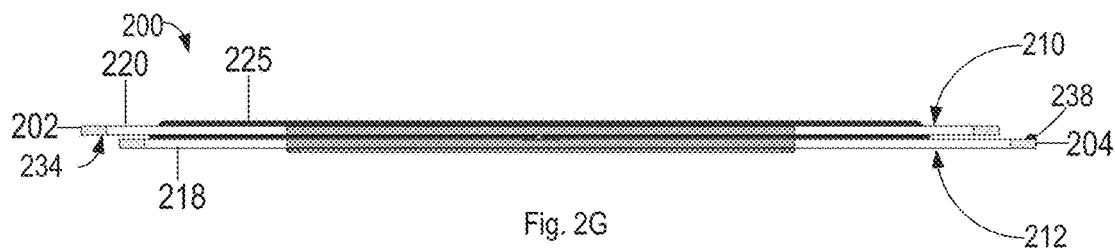
FIG. 2G shows a lower edge view of the PV module of FIG. 2A.
Figure 2H:
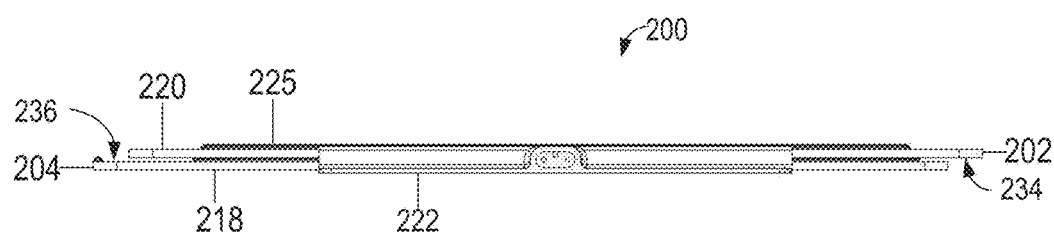
FIG. 2H shows an upper edge view of the PV module of FIG. 2A.
Figure 2I:
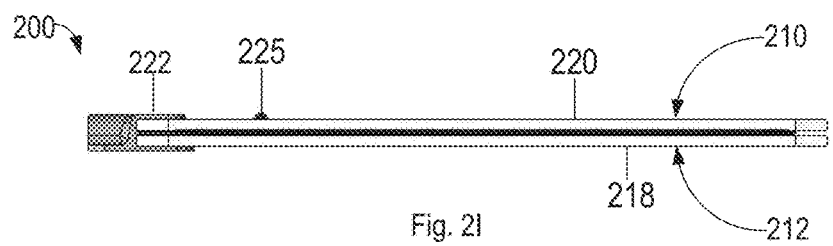
FIG. 2I shows a left edge view of the PV module of FIG. 2A.

FIGS. 2A and 2B show exemplary PV tile 200 for use with the BIPV technology disclosed herein. PV tile 200 is generally rectangular in shape and comprises left edge 202, right edge 204, upper edge 206, lower edge 208, outer surface 210 configured to face away from the underlying roof structure, and inner surface 212 configured to face toward the underlying roof structure when installed as a roof surface. PV tile 200 may have the dimensions of 222 mm by 356 mm by 6 mm. PV tile 200 includes laminate stack 221 that includes one or more PV cells 216 laminated between inner sheet 218 and outer sheet 220 with encapsulation layers 228 and 230. PV tile 200 further includes bracket 222 that includes a portion which is laminated between outer sheet 220 and inner sheet 218 with encapsulation layers 228 and 230 as shown in the side view and exploded side view of FIGS. 2C and 2D. Bracket 222 is attached laminate stack 221 at upper edge 206.

Outer sheet 220 forms an outer layer of PV tile 200 and is adhered to both backer 218 and PV cell 216 with encapsulation layer 230. Outer sheet 220 is light transmissive and may be substantially transparent and further is configured to allow solar energy to reach PV cells 216. Outer sheet 220 may be made of glass or transparent plastics. Outer sheet 220 may have the dimensions of 14 inches by 8.65 inches. Inner sheet 218 may have substantially the same dimensions as outer sheet 220. In embodiments, inner sheet 218 may be wider in the left-right direction than outer sheet 220, which allows inner sheets of adjacent PV tiles to contact or nearly contact when installed while leaving a gap between outer sheets of adjacent PV tiles. In embodiments, outer sheets and inner sheets may have the same thickness and/or be made of the same material. In embodiments, outer sheets and inner sheets may have different thicknesses and/or be made of different materials. For example, the thickness and material of outer sheets may be selected for light transmissivity properties and/or aesthetic properties and the thickness and material of inner sheets may be selected for structural and fire prevention related properties. In embodiments, outer sheets and/or inner sheets may have rounded edges and notched corners for aesthetic purposes, as well as for ease of handling during transport and installation.

In embodiments, inner sheet 218, outer sheet 220, and/or encapsulation layers 228 and 230 may be colored for aesthetic and/or functional purposes. For example, inner sheet 218 may be colored similarly to PV cells 216 in order to give PV tile 200 a uniform appearance when installed as a roof covering. Non-white colors can improve aesthetics by reducing glare or reflection off or through outer sheet 220. In embodiments, inner sheet 218 may be coated in in a blue or black coating to match coloring of conventional solar energy collecting material used in PV cells 216. Additionally, materials and/or coatings of inner sheet 218 can be selected for thermal dissipation or heat reflective properties, electrical insulation, or protection from damage, moisture, or UV degradation.

PV cell 216 can include multiple layers including solar energy collecting layers, semiconductor layers, bussing, and insulation sandwiched between encapsulation layers 228 and 230 when assembled in PV tile 200. Encapsulation layers 228 and 230 may be for example ethylene-vinyl acetate (EVA), thermoplastic polyolefin (TPO), or crosslink polyolefin (XPO). In embodiments, PV cells 216 are crystalline-based which can be either or both of monocrystalline or polycrystalline (multi-crystalline). As shown the laminate or wafer forming the solar energy-collecting PV cells 216 is adhered or bonded to top sheet 220 and back sheet 218 providing structural support and protection of PV cell 216 when assembled as a roof surface. In embodiments, PV cells 216 may comprise thin-film PV materials, such as cadmium telluride, copper-indium-gallium-diselenide ("CIGS"), or amorphous thin-film silicon. Further, in embodiments PV cells 216 may comprise perovskite or other currently known but not yet commercialized materials. The particular type of PV cell technology used for any given installation can be selected both for solar energy collecting functionality and for aesthetic qualities, as related to the present disclosure.

PV cells 216 in PV tile 200 may be electrically connected to each other, for example, in series, parallel, or a combination of the two. Wiring 217 for electrically connecting PV cells 216 within PV tile 200 may be laminated between inner sheet 218 and outer sheet 220. Embedded wiring in each PV tile electrically connected to PV cells 216 allows for modular assembly of PV tiles with reduced need for additional wiring or external components.

Laminate stack 221, including inner sheet 218, outer sheet 220, and PV cells 216, may be constructed with inner sheet 218 and outer sheet 220 offset in the left-right direction, as shown in FIGS. 2E-H. PV cells 216 are generally left-right centered in PV tile 200. The left-right offset of inner sheet 218 and outer sheet 220 forms lap joint components. Specifically, a portion of outer sheet 220 on left edge 202 is not overlapped by inner sheet 218 and forms upper lap joint portion 234, and a portion of inner sheet 218 on right edge 204 is not overlapped by outer sheet 220 and forms lower lap joint portion 236. In embodiment, lower lap joint portion 234 includes sealing member 238 proximate to right edge 204. Sealing member 238 may be a silicone strip, glue seal, release sheet or the like. As will be discussed in more detail below in relation to FIGS. 4A-4F, upper and lower lap joint portions 234 and 236 of side-roof adjacent PV tiles are overlapped to form a water resistant seal.

As will be discussed below in relation to FIGS. 4A-F, in embodiments PV tiles 200 are installed above an underlying roof structure to form a roof surface in an overlapping manner. Outer surface of outer sheet 220 includes a sealing member 225 proximate to bracket 222, as shown in FIG. 2A. Sealing member 225 may span at least a partial width of PV tile 200. When installed, a lower edge of an up-roof PV tile will contact the sealing member to form a seal. The portion of PV tile 200 down-roof of sealing member 225 is referred to as reveal portion 242 and the up-roof portion of PV tile 200, including bracket 222, is referred to as overlap portion 244 because when installed reveal portion 242 is visible by an outside observer and overlap portion 244 is covered by undersides of reveal portions of the next up-roof PV course of modules.

Figure 3A:
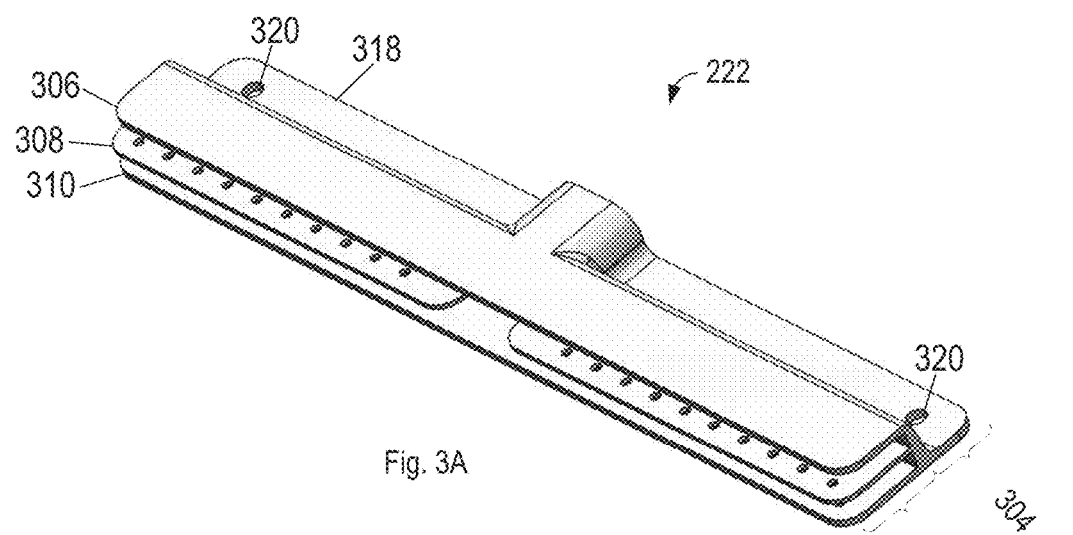
FIGS. 3A-3G show various views of a bracket, in accordance with embodiments of the disclosure.

FIG. 3A shows a top perspective view of bracket 222. Bracket 222 comprises laminate side 302 configured to receive laminate stack 221, and mounting side 304 configured to attach PV tile 200 to an underlying roof structure and electrically connect PV tiles to electrical distribution elements.

Laminate side 302 comprises three tiers of plates, top plate 306 middle plate 308 and bottom plate 310, which define two channels, bottom channel 312 and top channel 314. Top plate 306 middle plate 308 and bottom plate 310 each extend from base 311 of bracket 222. In embodiments, top plate 306 and bottom plate 308 each comprise a single portion spanning the width of bracket 222, as shown in FIG. 3A. In embodiments, middle plates 308 has two portions, left middle portion 308-1 and right middle portion 308-2, that are separated by gap 316 that allows wiring 217 from PV cells to connect to an electrical connector of bracket 222. In embodiments, middle plate 308 may have a thickness corresponding to the thickness of PV cells 216, and have a thickness of 0.2 mm to 1.5 mm. Top plate 306 and bottom plate 310 may have different thicknesses in the range of 2 mm to 6 mm. In embodiments middle plate 308 may have holes 309 configured to receive encapsulation material, from encapsulation layers 228 and/or 230 during lamination to create a mechanical bond in addition to an adhesive bond to more securely attach outer sheet 218 and inner sheet 220 of laminate stack 221 into bracket 222. For example, during assembly of PV tile 200 outer sheet 220, inner sheet 218, and uncured encapsulation layers 228 and 230 may be inserted in to bracket 222 with PV cells 216 positioned between inner sheet 218 and outer sheet 220, as shown in FIG. 2C. Once each component of PV tile 200 is positioned in the desired position, a heating lamination process may be used to cure encapsulation layers which may include compressing inner sheet 218, outer sheet 220, and bracket 222 between compliant heated arms of a lamination apparatus. The heat and compression may cause portions of encapsulation layer 228 and/or encapsulation layer 230 to flow into holes 309 of middle plate 308 of bracket 222 and subsequently cure to form the mechanical and adhesive bond. In embodiments, the number, size and pattern of holes may be selected based on the desired bond strength and the viscosity of encapsulation material.

In embodiments, top plate 306 middle plate 308 and bottom plate 310 may extend the same or different distances from base 311 of bracket 222. For example, as shown in FIG. 3E, top plate 306 extends a first distance from base 311, and middle plate 308 and bottom plate 310 extend a second distance, greater than first distance, from base 311. Top plate 306, middle plate 308 and bottom plate 310, may extend from base from 6 mm to 12 mm. Advantages of bottom plate 310 extending further from base 311 than top plate 306 include providing additional support to laminate stack 221 in a way that does not visually affect the appearance of PV tile 200 for an observer.

In embodiments, bracket 222 may be formed from a single piece of material, for example aluminum, and may be cast, molded, machined, or a combination thereof. In embodiments, to make holes 309 of middle plate 308 easier to manufacture bottom plate 310 may also include holes 313, as shown in FIG. 3C, formed in the same manufacturing step as holes 309. Also, it should be appreciated that in various embodiments, middle place 308 may be omitted to increase the ease of manufacturing.

Figure 3B:
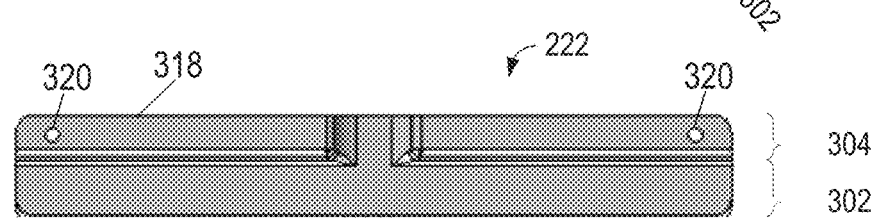
Figure 3C:
Figure 3D:
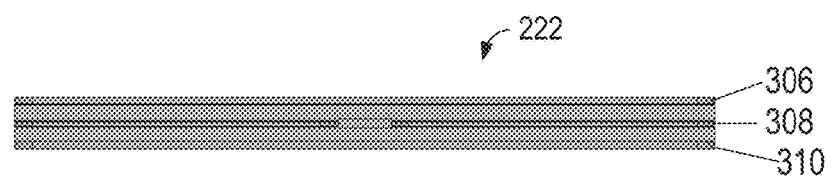
Figure 3E:
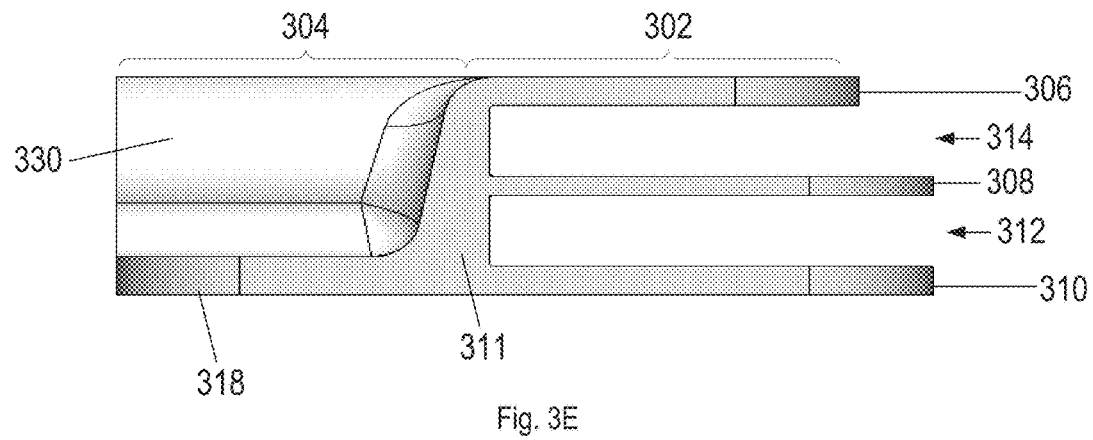

As shown in FIG. 3B, mounting side 304 extends away from the laminate side 302. As will be discussed below, when installed, mounting side 304 is located up-roof of laminate side 302. Mounting side 304 comprises mounting plate 318. Mounting plate 318 may extend the width of bracket 222, or a fraction thereof. In embodiments, mounting plate 318 is generally coplanar with bottom plate 310. Mounting plate 318 is sized in length, width and thickness to provide the necessary strength to attach PV tile 200 to an underlying roof structure and may have a thickness of 1.5 mm to 4 mm. In embodiments, as shown in FIG. 3B, mounting plate 318 includes holes 320 at left and right sides of bracket 222. Holes 320 are sized to accommodate fasteners (e.g. screws) to secure PV tile 200 to an underlying roof structure. For example screws may go through holes 320 and into roof decking. Two holes 320 are shown, however mounting plate 318 may have any number of holes and may include holes of different sizes for different sized fasteners. In embodiments, such as shown in FIGS. 5A-D, PV tile 500, similar to PV tile 200 discussed above, may include bracket 502 including batten hooks 504 configured to hook onto battens secured to an underlying roof structure. Bracket 502 may be constructed similarly to bracket 222. Bracket 502 includes middle plate 506, similar to middle plate 306, discussed above, and does not include top plates of middle plates. Laminate stack 221 is secured to middle plate 506 with a mechanical and adhesive bond of encapsulation materials through holes 508 in middle plate 506.

Figure 3F:
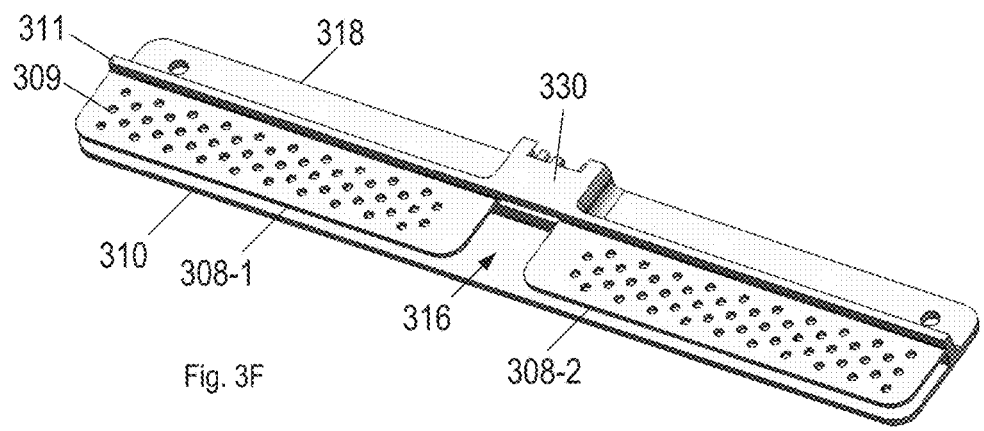
Figure 3G:
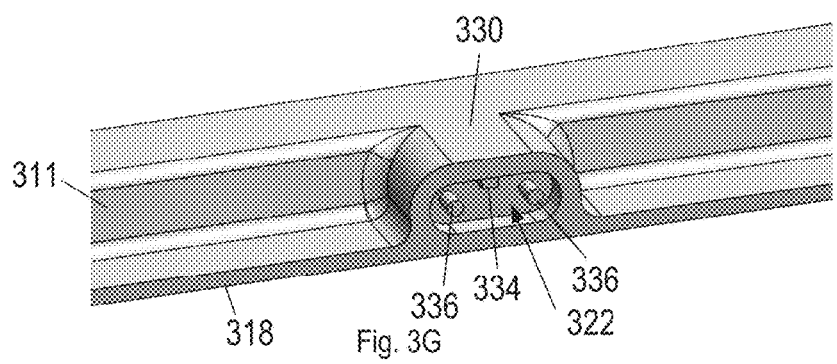

Mounting side 304 further includes electrical connector portion 330, as shown in FIG. 3G. Electrical connector portion 330 extends from base 311 away from laminate side 302. Electrical connector portion 330 may be in the middle of bracket 222 and portions of mounting plate 318 may be attached to and extend from both sides of electrical connecter portion 330. As shown in cross-section of FIG. 3F, gap 316 is defined between middle portions 308-1 and 308-2 which wiring 217 from PV cells 216 may pass through and electrically connect to electrical connector 322. Electrical connector 322 may be shaped to define a port including a detent 324 that only allows one orientation of an electrical cable to prevent installers from hooking up a PV tile 200 with the wrong polarity of leads 336.

Bracket 222 may house module level electrical distribution components, for example junction boxes, micro-inverters, and DC optimizers. As will be discussed below, when PV tiles 200 are installed as a roof, bracket in will be covered by up-roof PV tiles and hidden from view.

As shown, PV tiles 200 are generally frameless around the perimeter of outer sheet 220 and inner sheet 218. This frameless configuration is in contrast to framed PV modules, which provide attachment points along points around the frame. When installed, bracket 222 is covered by the adjacent up-roof course of PV tiles, and therefore frameless PV tiles have the advantage of providing a substantially uniform visual roof appearance that is substantially smooth and free of projecting visible boundaries between adjacent PV tiles, and also visually free of mounting hardware.

FIGS. 4A-F show an example assembly procedure for forming a BIPV roof comprised of PV tiles 200 as disclosed above. PV tiles 200 are installed over the roof plane to form a watertight or substantially watertight envelope above underlying roof structure 400. PV tiles 200 are arranged in horizontal rows, referred to as courses 402, along the width of underlying roof structure 400. Vertically adjacent courses of PV tiles may be offset from each other by about half the width of a standard size PV tile such that seams or breaks between two vertically adjacent rows of PV tiles do not form a single seam or break along the full slope of roof surface, but rather form an alternating pattern of seams. The offset pattern of seams provides better weatherproofing, and more secure attachment of PV tiles to underlying roof structure. Before, during, or after PV tiles are installed, additional roofing elements, including ridge flashing at the top of roof surface and eave flashing at the bottom of roof surface may be installed to form a complete roofing system.

Figure 4A:
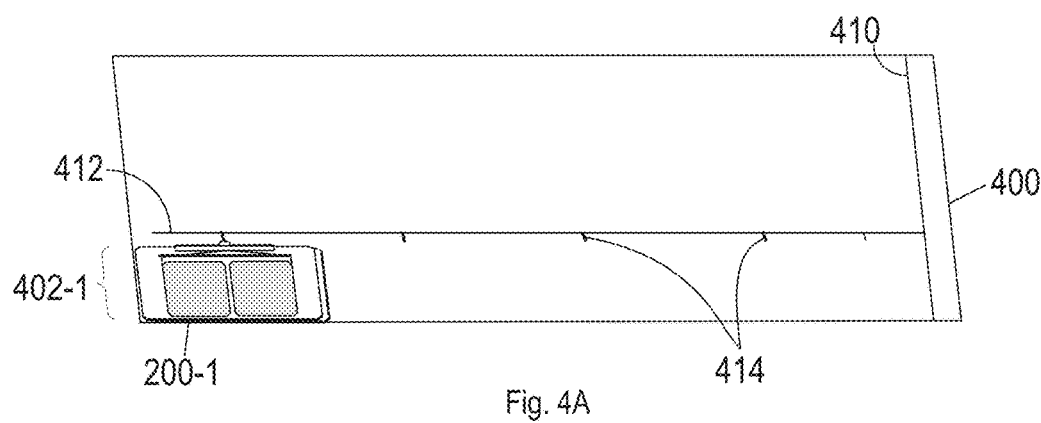
FIGS. 4A-F show exemplary steps for installing PV tiles on an underlying roof structure, in accordance with embodiments of the disclosure.
Figure 4B:
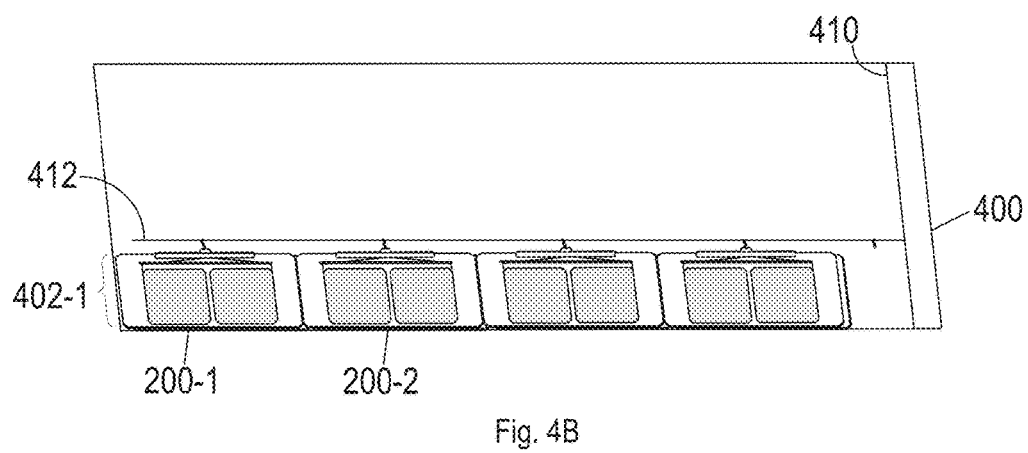

FIG. 4A shows a step of forming a BIPV roof system comprising securing first PV tile 200-1 with fasteners to start first course on underlying roof structure. As shown in FIG. 4B, after first PV tile 200-1 of first course 402-1 is secured, second PV tile 200-2, and subsequent PV tiles, of the same course can be secured adjacent to first PV tile 200-1 in order to extend first course 402-1. As discussed above, the offset assembly of outer sheets and inner sheets form lap joint features. Upper lap joint portion 234 of second PV tile 200-1 is overlapped with lower lap joint portion 236 of first PV tile 200-1, with sealing member pressed between the PV tiles. The left-right spacing of PV tiles may include a gap between outer sheets of adjacent PV tiles. The gap may range from 2 mm to 6 mm. In embodiments, varying the size of the gap between PV tiles in a course of PV tiles or in different courses may be used advantageously to accommodate imperfections in flatness, square-ness and/or dimensions of underlying roof structure 400.

Figure 4C:
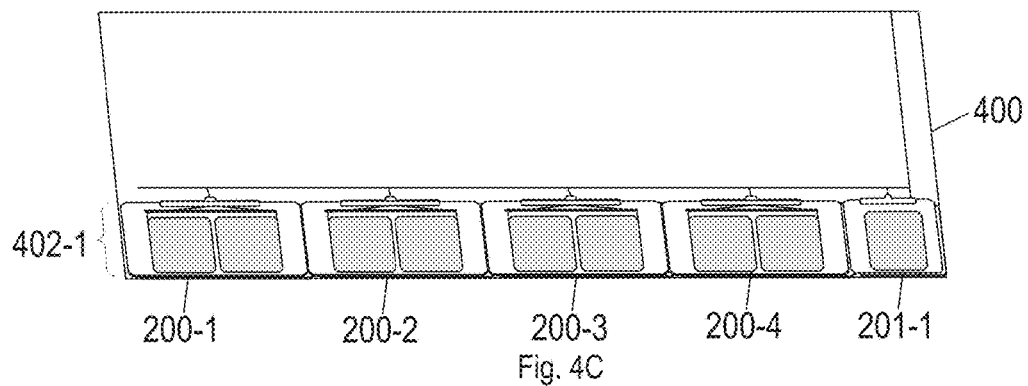

During installation, situations will occur where the width of an underlying roof structure is not an integer multiple of the width of the standard sized PV tiles being used. In these situations PV tiles, or non-PV tiles as will be discussed below, having different widths may be used in order for the course to have a width substantially matching the underlying roof structure width, while also having a substantially uniform aesthetic appearance. For example, in embodiments PV tiles may be half the width of a standard PV tile, and may include fewer PV cells than other PV tiles, or no PV cells. As shown in FIG. 4C, the intended width of roof surface corresponds to 4.5 standard size PV tiles. As shown, first course 402-1 includes first PV tile 200-1, second PV tile 200-2, third PV tile 200-3 and fourth PV tile 200-4, which in this embodiment are standard sized PV tiles each including two PV cells 216. In order to complete first course 402-1 to the intended width a fifth PV tile 201-1 half the width of the other PV tiles and including a single PV cell is used, as shown in FIG. 4C. Alternatively, wider PV tiles may be used that contain 3, 4, 5, 6, 7, or any other integer number of PV cells or portions of PV cells.

Figure 4D:
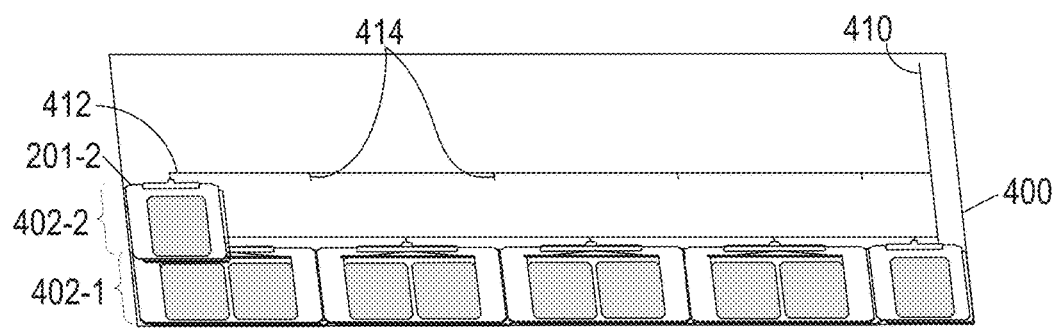
Figure 4E:
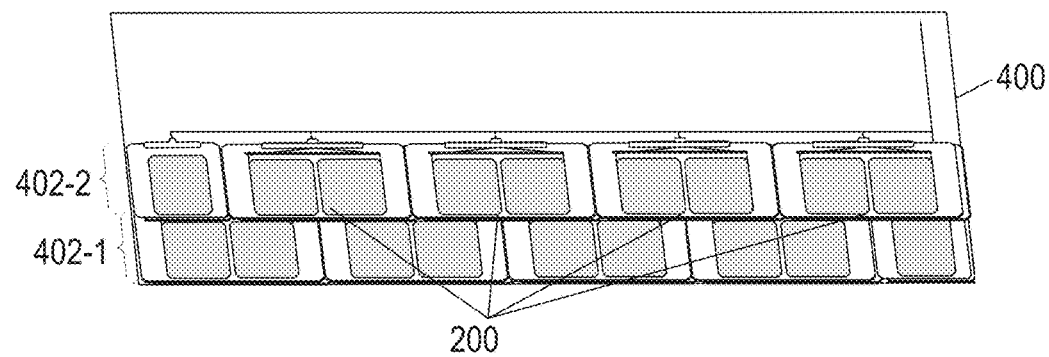
Figure 4F:
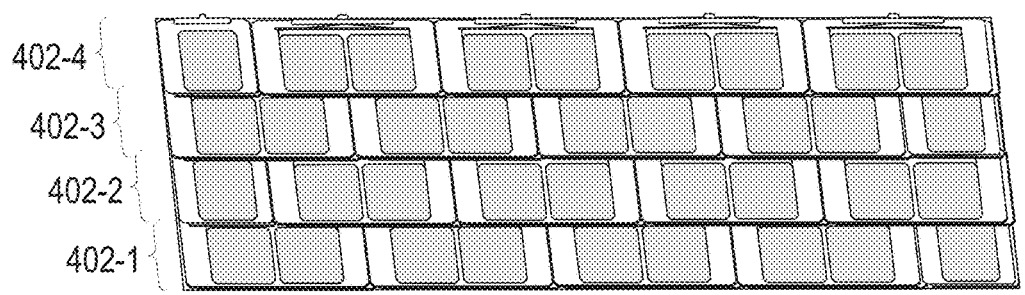
Figure 5A:
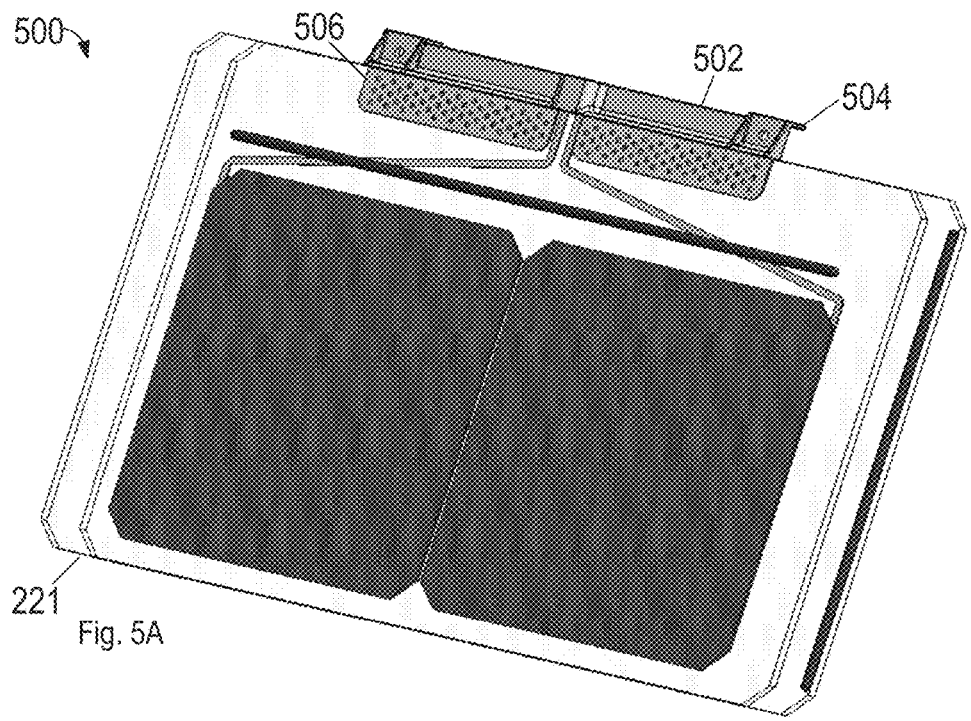
FIGS. 5A-5D show various views of a PV tile, in accordance with embodiments of the disclosure.
Figure 5B:
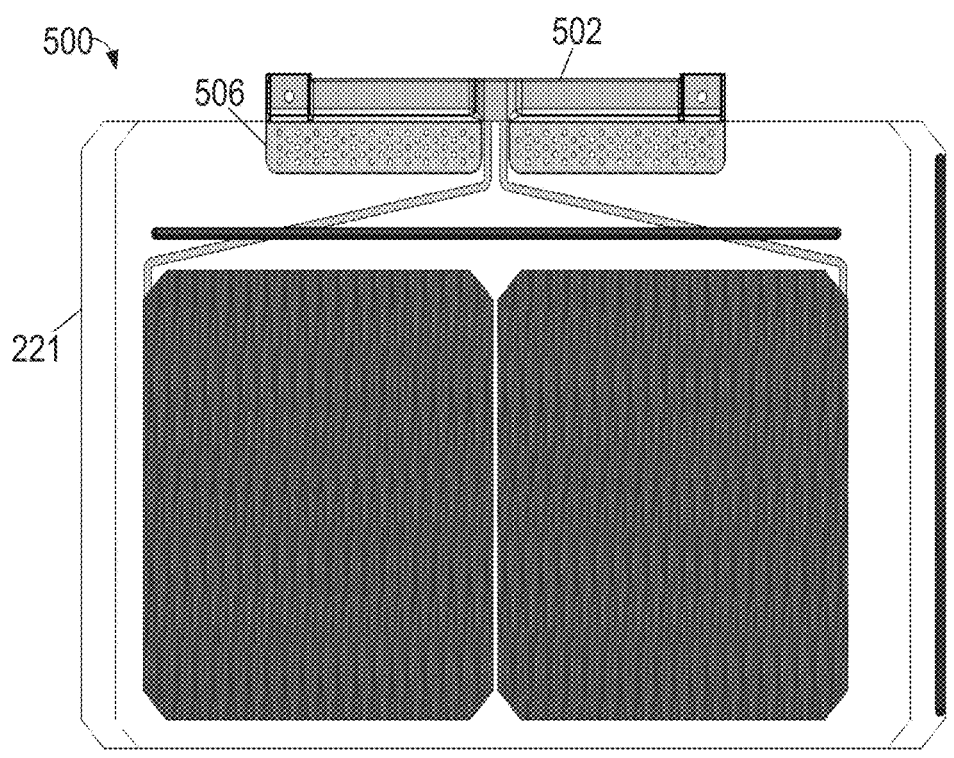
Figure 5C:
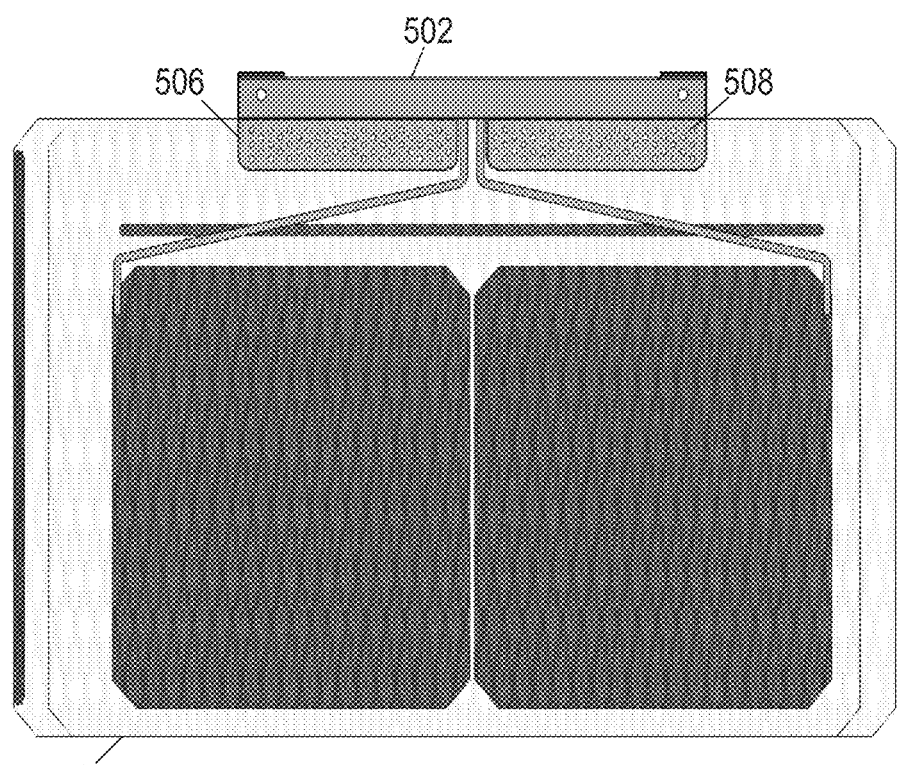
Figure 5D:
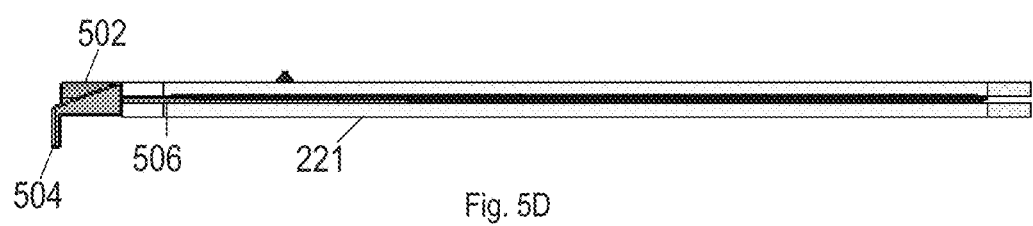

After a course of down-roof PV tiles are partially or fully installed, the next adjacent up-roof course can be installed. As shown in FIGS. 4D and 4E, second course 402-2 is installed up-roof of first course 402-1. Up-roof adjacent courses are offset in the left-right side-roof direction. In the example shown in FIG. 4D, second course 402-2 is started on the left side with half width PV tile 201-2. With this arrangement second course 402-2 of PV tiles are offset from first course 402-1 of PV modules by about half the width of one PV tile section, such that seams or breaks between two vertically adjacent rows of PV tiles do not form a single seam or break along the full slope of roof surface, but rather form an alternating pattern of seams, as shown in FIG. 4E. The up-roof PV tiles are installed so that sealing members 225 along upper surfaces of down-roof PV tiles contact bottom surface near lower edge of up-roof tiles. The steps shown in FIGS. 4D and 4E may be repeated for additional up-roof courses 402-3 and 402-4 in order to cover underlying roof structure 400, as shown in FIG. 4F.

As noted above, a BIPV array may include non-PV tiles. For example, not every portion of a roof may be amenable to, or need to be used for, solar energy generation. Therefore, in addition to PV tiles, for example as shown in FIG. 2A, a roof surface may additionally include non-PV tiles. Non-PV tiles may have an identical or near identical appearance to PV tiles and may be used on mounting planes that don't face South or that are shade, or around vents, roof edges, roof eaves, and other obstacles or non-standard conditions. Non-PV tiles may be manufactured in a similar manner as PV tiles, as discussed above, and include inner sheet 218, outer sheet 220 and bracket 222. Further, in embodiments non-PV tiles may include mock PV cells, for example a patterned decal or silicon element that appears similar to a PV cell but is not electrically connected to the power distribution network. The mock PV cells may be laminated between the outer sheet and inner sheet.

As used herein, PV tiles and non-PV tiles may be referred to collectively as roof tiles. During installation of a BIPV roof it may be advantageous to use a combination of different shapes and sizes of roof tiles, for example to manages obstacles or complete courses. Unlike the example shown in FIGS. 4A-F, which include a rectangular roof section free of obstacles, a roof section may include obstacles, for example skylights, chimneys, vents dormer, hips and valleys. The obstacles may have shapes and distributions that do not correspond to the arrangement of courses and/or the standard size of tile as disclosed above. In order to manage such obstacles, as noted above, roof tiles may be of any width. Additionally, roof tiles may be formed various shapes configured to manage various different obstacles. For example, roof tiles may be squares, rectangles, rhombuses, trapezoids, or triangles. In embodiments, some roof modules may be made of materials that facilitate trimming to precise shapes, for example transparent plastics, in order to accommodate obstacles with complex geometries and/or curves outlines. For example, a half circle may be cut out of a roof tile to fit around one side of a plumbing vent pipe.

In addition to completing courses, and managing obstacles, non-PV tiles may be used when the use of a PV tile is not economically efficient. For example, a roof may include portions that receive substantially different amounts of incident solar energy over the course of a day. In the Northern hemisphere a South-facing portion of a roof may receive substantially more solar energy than a North-facing portion. Further portions of a roof may be occluded from receiving sun light over the course of the day due to trees, other roof portions, or nearby buildings. The amount of energy PV tiles received in these areas may not justify the costs of the PV tiles. Therefore, these areas may be installed with non-PV tiles, that allow for the entire roof to have a consistent appearance, without the added costs of inefficient PV tile placements. Additionally, non-PV tiles may also be used for example on non-occluded portions of a roof in cases where a desired power output is achieved with PV tiles on only a portion the non-occluded roof.

In embodiments electrical connections on the underlying roof structure may be installed prior to PV tile installation. The electrical connections may be located beneath roof tiles when roof tiles are installed. For example, as shown in FIGS. 4A-F, wiring harness 412, may be installed on underlying roof structure 400 along a course. Wiring harness 412 may include electrical connectors 414 that are spaced according to the spacing of the PV tiles in the course. Wiring harnesses 412 of each course may be connected to vertical trunk line 410 that extends along an edge of underlying roof structure 400. The underlying roof structure may have voltage or current inverters, power meters, electrical drops, optimizers, transformers, or the like attached to it, which one or more courses of PV tiles are electrically coupled and which can then route electricity into an main electrical panel of the building or toward the electrical grid. In embodiments, PV tiles in a course may each electrically couple to power bus bars running along the course and attached to the underlying roof structure. In embodiments, PV tiles are electrically connected together in strings, such as with junction boxes, micro-inverters, DC optimizers, power bus bars, or other local/module-level electronics.

From the foregoing, it will be appreciated that specific embodiments of the invention have been described herein for purposes of illustration, but that various modifications may be made without deviating from the spirit and scope of the various embodiments of the invention. Further, while various advantages associated with certain embodiments of the invention have been described above in the context of those embodiments, other embodiments may also exhibit such advantages, and not all embodiments need necessarily exhibit such advantages to fall within the scope of the invention. Accordingly, the invention is not limited, except as by the appended claims.

While the above description describes various embodiments of the invention and the best mode contemplated, regardless how detailed the above text, the invention can be practiced in many ways. Details of the system may vary considerably in its specific implementation, while still being encompassed by the present disclosure. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

The teachings of the invention provided herein can be applied to other systems, not necessarily the system described above. The elements and acts of the various examples described above can be combined to provide further implementations of the invention. Some alternative implementations of the invention may include not only additional elements to those implementations noted above, but also may include fewer elements. Further any specific numbers noted herein are only examples; alternative implementations may employ differing values or ranges, and can accommodate various increments and gradients of values within and at the boundaries of such ranges.

References throughout the foregoing description to features, advantages, or similar language do not imply that all of the features and advantages that may be realized with the present technology should be or are in any single embodiment of the invention. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment.

Furthermore, the described features, advantages, and characteristics of the present technology may be combined in any suitable manner in one or more embodiments. One skilled in the relevant art will recognize that the present technology can be practiced without one or more of the specific features or advantages of a particular embodiment. In other instances, additional features and advantages may be recognized in certain embodiments that may not be present in all embodiments of the present technology.

Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

Although certain aspects of the invention are presented below in certain claim forms, the applicant contemplates the various aspects of the invention in any number of claim forms. Accordingly, the applicant reserves the right to pursue additional claims after filing this application to pursue such additional claim forms, in either this application or in a continuing application.

The invention claimed is:

1. A photovoltaic tile comprising:
a light transmissive outer sheet;
an inner sheet;
at least one photovoltaic cell, encapsulated between the light transmissive outer sheet and inner sheet; and
a bracket at a first edge of the photovoltaic tile comprising a first plate positioned between the light transmissive outer sheet and inner sheet, and a mounting portion configured to secure the photovoltaic tile to a roof structure;
wherein the bracket further comprises:
a second plate; and
a third plate,
wherein the first plate and the second plate define a first channel and the light transmissive outer sheet is positioned within the first channel, and
wherein the first plate and the third plate define a second channel and the inner sheet is positioned within the second channel.

2. The photovoltaic tile of claim 1, wherein the first plate defines a first plurality of holes, wherein the light transmissive outer sheet and the inner sheet are adhered to an encapsulation material, and wherein the encapsulation material is present within the plurality of holes.

3. The photovoltaic tile of claim 2, wherein the third plate defines a second plurality of holes corresponding to the first plurality of holes of the first plate.

4. The photovoltaic tile of claim 1, further comprising:
electrical wiring, wherein the electrical wiring is electrically connected to the at least one photovoltaic cell and is positioned between the light transmissive outer sheet and the inner sheet,
wherein the bracket comprises an electrical connector configured to connect the photovoltaic tile to an electrical distribution system,
wherein the bracket defines a gap between a first portion of the first plate and a second portion of the first plate, and
wherein the wiring extends through the gap and connects to the electrical connector.

5. The photovoltaic tile of claim 1, wherein the first edge extends in a first direction,
wherein the light transmissive outer sheet and the inner sheet are offset from each other in the first direction so that a portion of the light transmissive outer sheet along a second edge, perpendicular to the first edge, is not overlapped by the inner sheet and forms an upper lap joint portion, and a portion of the inner sheet along a third edge, opposite the second edge, is not overlapped by the light transmissive outer sheet and forms a lower lap joint portion, and
wherein the upper lap joint portion and the lower lap joint portions are configured to form lap joints with substantially identical photovoltaic tiles when installed as part of a roof assembly.

6. The photovoltaic tile of claim 1, further comprising a sealing strip attached to an outer surface of the light transmissive outer sheet, wherein the sealing strip is configured to contact and form a seal with an outer surface of an inner sheet of a substantially identical photovoltaic tile when installed as part of a roof assembly.

7. The photovoltaic tile of claim 1, wherein the inner sheet and the light transmissive outer sheet have substantially identical thicknesses and are composed of substantially identical materials.

8. The photovoltaic tile of claim 1, wherein the mounting portion comprises batten hooks configured to engage battens secured to the roof structure.

9. The photovoltaic tile of claim 1, further comprising:
a second edge opposite the first edge; and
a third edge and a fourth edge, each perpendicular to the first edge and the second edge,
wherein the second edge, the third edge and the fourth edge are frameless.

10. A building integrated photovoltaic system, comprising:
a plurality of photovoltaic tiles, comprising a first photovoltaic tile and a second photovoltaic tile, attached to an underlying roof structure, wherein each of the plurality of photovoltaic tiles comprise:
a light transmissive outer sheet;
an inner sheet;
at least one photovoltaic cell, encapsulated between the light transmissive outer sheet and inner sheet; and
a bracket at a first edge of the photovoltaic tile comprising a first plate positioned between the light transmissive outer sheet and inner sheet, and a mounting portion configured to secure the photovoltaic tile to the underlying roof structure, wherein the bracket of the first photovoltaic tile is attached to the underlying roof structure at a first position, and
wherein the bracket of the second photovoltaic tile is attached to the underlying roof structure at a second position up-roof and adjacent to the first position so that at least a first portion of the bracket of the first photovoltaic tile is covered by the inner sheet of the second photovoltaic tile;
wherein for each of the plurality of photovoltaic tiles the light transmissive outer sheet and the inner sheet are offset from each other in the first direction so that a portion of the light transmissive outer sheet along a second edge, perpendicular to the first edge, is not overlapped by the inner sheet and forms an upper lap joint portion, and a portion of the inner sheet along a third edge, opposite the second edge, is not overlapped by the light transmissive outer sheet and forms a lower lap joint portion,
wherein the plurality of photovoltaic tiles further comprise a third photovoltaic tile,
wherein the bracket of the third photovoltaic tile is attached to the underlying roof structure at a third position side-roof adjacent to the second position so that at least a second portion of the bracket of the first photovoltaic tile is covered by the inner sheet of the third photovoltaic tile, and
wherein the upper lap joint portion of the third photovoltaic tile overlaps the lower lap joint portion of the second photovoltaic tile to form a lap joint.

11. The system of claim 10, wherein the first photovoltaic tile comprises a sealing strip attached to an outer surface of the light transmissive outer sheet, and
wherein the respective inner sheets of the second photovoltaic tile and the third photovoltaic tile contact the sealing strip and form a seal.

12. The system of claim 10, further comprising:
a trunk line;
a first wire harness comprising a first connector and a second connector, wherein the first wire harness is electrically connected to the trunk line; and
a second wire harness comprising a third connector wherein the second wire harness is electrically connected to the trunk line, wherein the bracket of the first photovoltaic module comprises a first electrical connector electrically connected to the at least one photovoltaic cell of the first photovoltaic tile, and the first connector is electrically connected to the first electrical connector;

wherein the bracket of the second photovoltaic module comprises a second electrical connector electrically connected to the at least one photovoltaic cell of the second photovoltaic tile, and the second connector is electrically connected to the second electrical connector; and wherein the bracket of the third photovoltaic module comprises a third electrical connector electrically connected to the at least one photovoltaic cell of the third photovoltaic tile, and the third connector is electrically connected to the third electrical connector.

* * * * *